(12) United States Patent
Lindert et al.

(10) Patent No.: US 7,314,804 B2
(45) Date of Patent: Jan. 1, 2008

(54) PLASMA IMPLANTATION OF IMPURITIES IN JUNCTION REGION RECESSES

(75) Inventors: Nick Lindert, Beaverton, OR (US); Mitchell C. Taylor, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 244 days.

(21) Appl. No.: 11/029,742

(22) Filed: Jan. 4, 2005

(65) Prior Publication Data

US 2006/0148220 A1 Jul. 6, 2006

(51) Int. Cl.
*H01L 21/336* (2006.01)
(52) U.S. Cl. .................. 438/305; 438/300; 438/369; 438/514; 257/E21.473
(58) Field of Classification Search ............ 438/369, 438/513, 524, 561; 257/E21.135, E21.147, 257/E21.466, E21.473
See application file for complete search history.

(56) References Cited

U.S. PATENT DOCUMENTS 6,872,626 B1 * 3/2005 Cheng ..................... 438/299
2002/0190284 A1 * 12/2002 Murthy et al. ........... 257/286
2004/0173815 A1 * 9/2004 Yeo et al. ................ 257/192

* cited by examiner

*Primary Examiner*—Walter Lindsay, Jr.
*Assistant Examiner*—Cheung Lee
(74) *Attorney, Agent, or Firm*—Blakely, Sokoloff, Taylor & Zafman LLP

(57) ABSTRACT

A transistor device having a conformal depth of impurities implanted by isotropic ion implantation into etched junction recesses. For example, a conformal depth of arsenic impurities and/or carbon impurities may be implanted by plasma immersion ion implantation in junction recesses to reduce boron diffusion and current leakage from boron doped junction region material deposited in the junction recesses. This may be accomplished by removing, such as by etching, portions of a substrate adjacent to a gate electrode to form junction recesses. The junction recesses may then be conformally implanted with a depth of arsenic and carbon impurities using plasma immersion ion implantation. After impurity implantation, boron doped silicon germanium can be formed in the junction recesses.

18 Claims, 4 Drawing Sheets

PLASMA IMPLANTATION OF IMPURITIES IN JUNCTION REGION RECESSES

BACKGROUND

1. Field

Circuit devices and the manufacture and structure of circuit devices.

2. Background

Increased performance in circuit devices on a substrate (e.g., integrated circuit (IC) transistors, resistors, capacitors, etc. on a semiconductor (e.g., silicon) substrate) is typically a major factor considered during design, manufacture, and operation of those devices. For example, during design and manufacture or forming of metal oxide semiconductor (MOS) transistor devices, such as those used in a complementary metal oxide semiconductor (CMOS), it is often desired to increase movement of electrons in N-type MOS device (NMOS) channels and to increase movement of positive charged holes in P-type MOS device (PMOS) channels. To increase movement of electrons and holes, (e.g., also referred to as "charge carriers"), feature sizes of the transistor devices are often reduced. For example, the channel length of a device may be shortened so that charge carriers move from one junction region to another more quickly. Reduction in channel length may lead to excessive leakage current if the doped junction (or source/drain) regions of the transistor become too close together. This can happen if the junction region dopants diffuse beyond the desired doping region due to subsequent thermal treatment. For example, for a PMOS device, boron out-diffusion may extend from the junction regions into the channel, thus increasing leakage current between the junction regions. Similarly, when gate length is reduced, short channel effects may suffer unless the lateral depletion region is reduced as well. Thus, during design and manufacture of PMOS devices, it is often desired to reduce boron out-diffusion from P-type junction regions into the channel during thermal treatment of the device after forming the junction regions. Similarly, during such design, it is often desired to reduce leakage current amounts and the lateral depletion width between junction regions and the channel.

BRIEF DESCRIPTION OF THE DRAWINGS

Various features, aspects and advantages will become more thoroughly apparent from the following detailed description, the set of claims, and accompanying drawings in which:

DETAILED DESCRIPTION

Figure 1:
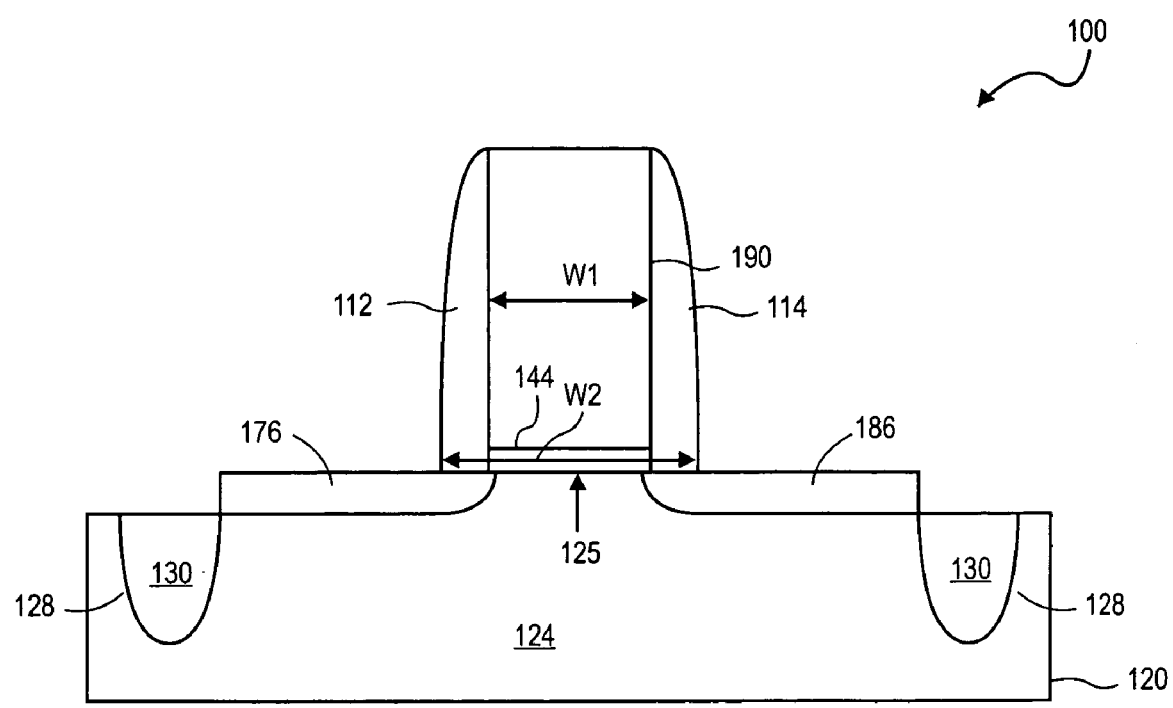
FIG. 1 is a schematic cross-sectional view of a portion of a substrate having a well, gate dielectric, gate electrode, and tip material.

FIG. 1 is a schematic cross-sectional view of a portion of a substrate having a well, gate dielectric, gate electrode, and tip material. FIG. 1 shows apparatus 100 including substrate 120 having gate dielectric 144 formed on top surface 125 of substrate 120 over well 124. Gate electrode 190 is formed on gate dielectric 144 and has spacers 112 and 114 formed on its side surfaces. Electrically insulating material 130 is also shown to electronically isolate well 124 from surrounding regions 128. Tip material 176 and 186 are shown adjacent to gate electrode 190. Apparatus 100, and components thereof described above may be further processed, such as in a semiconductor transistor fabrication process that involves one or more processing chambers, to become or be parts of a PMOS or NMOS transistor (e.g., by being parts of a CMOS device).

For example, substrate 120 may include, be formed from, deposited with, or grown from silicon, polycrystalline silicon, single crystal silicon, or various other suitable technologies for forming a silicon base or substrate, such as a silicon wafer. For example, according to embodiments, substrate 120 may be formed by growing a single crystal silicon substrate base material having a thickness of between 100 Angstroms and 1000 Angstroms of pure silicon. Alternately, substrate 120 may be formed by sufficient chemical vapor deposition (CVD) of various appropriate silicon or silicon alloy materials to form a layer of material having a thickness between one and three micrometers in thickness, such as by CVD to form a thickness of two micrometers in thickness. It is also considered that substrate 120 may be a relaxed, non-relaxed, graded, and/or non-graded silicon alloy material.

As shown in FIG. 1, substrate 120 includes well 124, such as an N-type well formed by doping substrate 120 during formation or after formation of substrate 120. Specifically, to form well 124, top surface 125 may be doped with phosphorous, arsenic, and/or antimony to form an N-type well of a PMOS transistor (e.g., a PMOS device of a CMOS device). Top surface 125 may be selectively doped, such as by placing a mask over the non-selected area or areas to block the introduction of the dopant from entering the non-selected area or areas, while allowing the dopant to dope well 124. Thus, well 124 may be a material suitable for forming a "channel" of a transistor device. For example, a transistor device channel maybe defined as a portion of the material of well 124 under top surface 125 and between tip material 176 and 186, or junction regions formed adjacent to, consuming portions of, and/or including tip material 176 and 186.

FIG. 1 shows electrically insulating material 130 between well 124 and surrounding regions 128. Material 130 may be various appropriate electronically insulating materials and structures sufficient for electronically isolating well 124 from surrounding regions 128. For example, surrounding regions 128 may be well regions of adjacent or related transistor devices. Specifically, material 130 may be shallow trench isolation (STI) formed between an N-type well of a PMOS device (e.g., where well 124 has an N-type well) and other regions of substrate 120 to electronically isolate the well from other regions of substrate 120 to provide for functionality of a transistor formed on top surface 125 (e.g., to isolate well 124 from an adjacent well of an associated device paired with well 124 to form a CMOS device). In one example, where well 124 has an N-type well, one of regions 128 may be a related P-type well of an NMOS device paired with a PMOS device formed on top surface 125 to form a CMOS device. Material 130 may be formed by doping through a layer of material located above material 130, and/or may be formed before or after forming well 124.

As shown in FIG. 1, gate dielectric 144 between gate electrode 190 and surface 125. Gate electrode 190 is shown formed on gate dielectric 144 with length W1. The thickness of gate dielectric 144 may be generally consistent throughout and conform to the topography of top surface 125.

Moreover, gate dielectric 144 may be formed of a material having a relatively high dielectric constant (e.g., a dielectric constant greater than or equal to that of silicon dioxide ($SiO_2$), or of a material having a relatively low dielectric constant. A thickness of gate dielectric 144 may be between 1 and 5 nanometers (nm) in thickness. Gate dielectric 144 may be formed by deposition, such as by CVD, atomic layer deposition (ALD), blanket deposition, selective deposition, epitaxial deposition, ultra high vacuum (UHV) CVD, rapid thermal (RT) CVD, reduced pressure (RP) CVD, molecular beam epitaxy (MBE), and/or other appropriate growing, depositing, or forming processes. Specifically, gate dielectric 144 may be formed of dielectrics such as silicon dioxide ($SiO_2$), hafnium oxide (HfO), hafnium silicate ($HfFiO_4$), zirconium oxide (ZrO), carbon doped oxide (CDO), cubic boron nitride (CBN), phosphosilicate glass (PSG), silicon nitride ($Si_3N_4$), fluorinated silicate glass (FSG), silicon carbide (SiC), etc.

Gate electrode 190 may be formed by processes, such as those described above with respect to forming gate dielectric 144. Moreover, gate electrode 190 may be formed of various semiconductor or conductor materials, such as silicon, polysilicon, crystal silicon, and/or various other appropriate gate electrode materials. Also, gate electrode 190 may be doped during or after formation. For example, gate electrode 190 maybe doped with boron and/or indium to form a P-type gate electrode (e.g., for a PMOS device, which may be part of a CMOS device).

Gate electrode 190 may have a thickness appropriate for apparatus 100, such as a PMOS device. For example, gate electrode 190 may have a work function to cause a transistor formed on substrate 120 to have a threshold "ON" voltage between 0.1 and 0.5 volts. Gate electrode 190 may have a work function for responding to a gate electrode of a PMOS device (e.g., where apparatus 100 is a PMOS device). In some cases, gate electrode 190 may have a thickness of, for example, between 150 and 2000 Angstroms (e.g., between 15 and 200 nanometers (nm)).

FIG. 1 shows spacer 112 and spacer 114 formed on side surfaces of gate electrode 190 and gate dielectric 144. Specifically, spacer 112 and spacer 114 may be formed on sidewall surfaces of gate electrode 190 and gate dielectric 144, and formed on a top surface of substrate 120 (e.g., including on tip material 176 and 186)). Thus, as shown in FIG. 1, length W2 may define a length equal to the length of gate dielectric 144, plus the length of spacers 112 and 114. Spacers 112 and 114 may be a dielectric material such as silicon nitride ($Si_3N_4$), silicon dioxide ($SiO_2$), and/or various other appropriate semiconductor devices spacer materials.

For example, spacers 112 and 114 may be formed by first depositing dielectric material, similar to dielectric materials described above for gate dielectric 144, conformally along surfaces of substrate 120, sidewall surfaces of gate electrode 190 and gate dielectric 144, and a top surface of gate electrode 190 (or an etch stop layer performed thereon). Then the formed or deposited dielectric material may be etched to create spacers 112 and 114.

FIG. 1 also shows tip material 176 and tip material 186 formed in substrate 120 adjacent to gate electrode 190. Specifically, doping may be used to dope portions of substrate 120 with boron and/or indium (e.g., impurities) to form P-type material (e.g., to form tip material 176 and 186). For example, tip material 176 and 186 may be formed by P-type doping, such as to implant boron and/or indium into well 124 at a normal angle with respect to surface 125 so that tip material 176 and 186 extends under gate dielectric 144 due to scattering when the impurities impact the silicon lattice within substrate 120. Such directional ion or impurity implantation, may be performed by an ion "gun", or an ion "implanter" to bombard surfaces of substrate 120 with accelerated high velocity ions to implant impurities to form tip material 176 and 186.

After forming tip material 176 and 186, portions of tip material 176, tip material 186, and well 124 may be removed to form junction recesses in substrate 120 adjacent to gate electrode 190. For example, junction regions adjacent to gate electrode 190 may be formed by removing portions of substrate 120 to form junction recesses or recesses in substrate 120, and then forming or depositing junction material 186 into the junction recesses. Such removal may include "undercut" etching, so that the junction recesses extend under gate dielectric 144.

Figure 2:
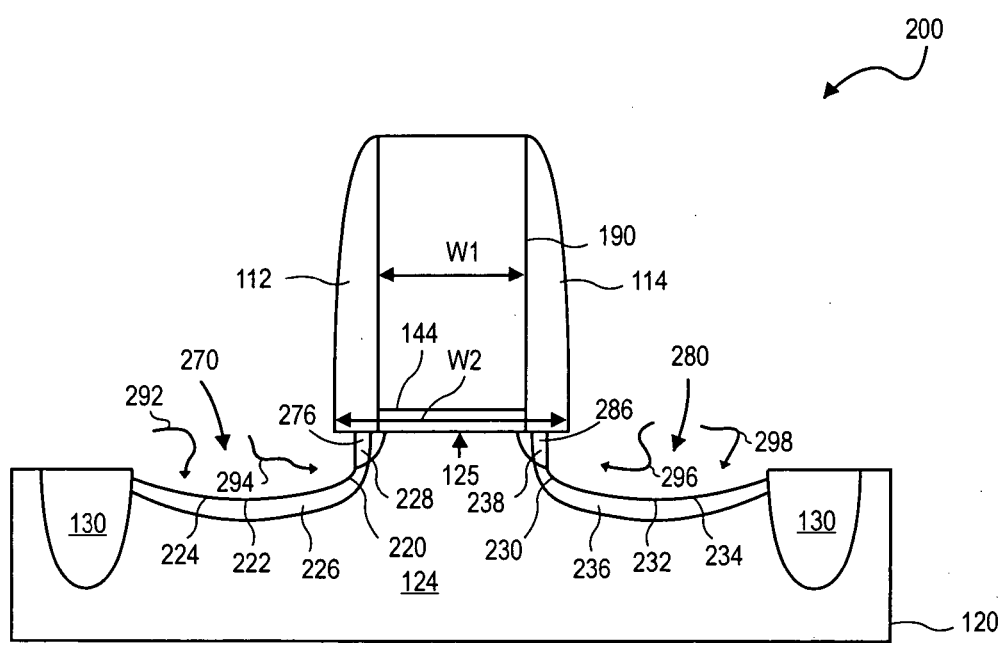
FIG. 2 is the schematic substrate of FIG. 1 after forming junction recesses and implanting a conformal depth of an impurity in the junction recesses.

For example, FIG. 2 is the schematic substrate of FIG. 1 after forming junction recesses and implanting a conformal depth of an impurity in the junction recesses. FIG. 2 shows junction recess 270 superadjacent to and defining surface 224 of substrate 120, where surface 224 includes junction base surface 222 and sidewall surface 220. In addition, junction recess 270 defines tip 276 (e.g., by etching a portion of tip material 176, but leaving the portion of tip material 176 that is tip 276). Tip 276 may be part of sidewall surface 220. Similarly, FIG. 2 shows junction recess 280 defining surface 234 of substrate 120, where surface 234 includes junction base 232 and substrate sidewall surface 230. Junction recess 280 also defines tip 286 (e.g., described above with respect to junction recess 270 defining tip 276). Tip 286 may be part of sidewall surface 230 Tips 276 and 286 may extend under gate dielectric 144, spacers 112 and 114, and/or gate electrode 190. Tips 276 and 286 may extend under gate electrode 190 along top surface 125, without contacting each other.

Junction recesses 270 and 280 may also be referred to as recesses in which "source/drain regions" or "diffusion regions" can be formed. Thus, when an appropriate material is formed, deposited, or grown in junction recesses 270 and 280, the resulting material and structure may be referred to as a junction region, a source region, a drain region, or a diffusion region.

Junction recesses 270 and 280 may be formed by "undercut" etching of substrate 120 and/or tip materials 176 and 186, such as to etch under gate dielectric 144, as shown in FIG. 2. For example, junction recesses 270 and 280 may be formed by removing undesired portions of substrate 120 and/or tip material 176 and 186, by patterning a mask layer over a defined area of apparatus 100 and etching away the undesired exposed portions, not covered by the mask. Photolithographic patterning using an etch stop, dielectric material, photoresist, or other suitable material for masking and etch processing (e.g., a negative photoresist mask, positive photoresist mask, silicon dioxide ($SiO_2$), or silicon nitride ($Si_3N_4$)) may be used to define an area to be protected while undercut etching to form junction recesses 270 and 280, as shown in FIG. 2. Suitable etch chemistries include a chlorine-etchant, a hydrochloric acid (HCl) etchant, a $CF_4$ chemistry, a plasma etchant, a sputter etchant, and/or other etch processes capable of removing portions of tip material 176 and 186, and substrate 120.

Junction recesses 270 and 280 may extend under gate dielectric 144 along top surface 125, without contacting each other. It may also be appreciated that during formation, junction recesses 270 and 280 may consume tip material or tips, such as tips 276 and 286. Also, junction recesses 270 and 280 may be junction recesses formed in a substrate not having tips.

FIG. 2 also shows conformal depth 226 of an impurity extending into surface 224 of substrate 120, and conformal depth 236 of an impurity extending into surface 234 of substrate 120. Conformal depth 226 may extend conformally through a depth of junction base surface 222 and substrate sidewall surface 220. Moreover, conformal depth 226 may extend into region 228 of tip 276. Similarly, conformal depth 236 of an impurity may extend conformally into a depth of junction base 232, substrate sidewall surface 230, and region 238 of tip 286. Thus, conformal depth 226 and 236 may extend under, adjacent to, superadjacent to, and contacting a bottom surface of gate dielectric 144. Conformal depth 226 and 236 may also extend under and adjacent to spacers 112 and 114, and/or to gate electrode 190. Conformal depth 226 and 236 may extend along top surface 125 under gate dielectric 144 without contacting each other.

According to embodiments, conformal depth 226 and/or 236 may be a depth of substrate 120 and/or well 124 doped with impurities or atoms of arsenic (As), carbon (C), either, or both. For example, conformal depth 226 and/or 236 may be formed by ion implantation into substrate 120 and/or well 124 of arsenic (As), carbon (C), either, or both. Ion implantation of carbon and/or arsenic to form depth 226 and 236 may provide sufficient depth of carbon and/or arsenic impurities to provide a type of "halo" implantation protection, such as by reducing lateral depletion region width, suppressing boron out-diffusion, and improving short channel effects. Specifically, conformal depth 226 and/or 236 may be a depth of substrate 120 and/or well 124 doped with impurities or atoms of arsenic (As), carbon (C), or both extending into regions 228 and 238 a in a lighter or less concentrated dose than a dose of boron or indium already doped or to be doped into regions 228 and 238. Thus, conformal depth 226 and/or 236 may be a depth of lighter or less concentrated N-type negative impurities or atoms than a dose of P-type impurities or atoms already existing in tips 276 and 286, so that regions 228 and 238 ultimately have a P-type electronically positive charge.

For instance, conformal depth 226 and 236 may be deposited by an isotropic ion implantation, such that impurities are implanted conformally in a depth of junction base surface 222 and 232, as well as sidewall surfaces 220 and 230 (e.g., including region 228 and 238). Thus, an ion implantation to form conformal depth 226 and 236 may be performed by plasma immersion ion implantation, or other doping, impurity, or ion implantation processes providing a relatively shorter mean free path between ions incident to surfaces 224 and 234 than a unidirectional ion bombardment of high velocity ions having a relatively longer mean free path. Thus, ions may enter surface 224 and 234 at-various angles during impact to form conformal depth 226 and 236. Specifically, appropriate ion implantation (e.g., plasma immersion ion implantation) provides ions with a mean free path incident upon surfaces 224 and 234 such that some implantation is included along junction base surfaces 222 and 232, as well as along sidewall surfaces 220 and 230 (e.g., including regions 228 and 238).

For example, FIG. 2 shows path 292, 294, 296, and 298 which may be representative mean free paths of ions being isotropically implanted (e.g., via plasma immersion ion implantation) into surfaces 224 and 234. It is contemplated that isotropic implantation of ions may include implanting arsenic and then carbon, implanting a carbon and then arsenic, implanting arsenic and carbon at the same time, only implanting carbon, or only implanting arsenic to form conformal depth 226 and 236.

Appropriate examples include implanting arsenic at an ion energy of between 10 and 70 Kilo-electron volts, and at a dose of between 1.0 E12 and 1.0 E14 atoms per centimeter squared. Also, appropriate examples include implanting carbon at an ion energy of between 2.0 and 15 Kilo-electron volts, and at a dose of between 1.0 E14 and 1.0 E16 atoms per centimeter squared. Moreover it is contemplated that such arsenic implantation may include at an ion energy of between 1 and 200 Kilo-electron volts, and at a dose of between 1.0 E10 and 1.0 E16 atoms per centimeter squared. Also, contemplated carbon implantation may include at an ion energy of between 0.5 and 50 Kilo-electron volts, and at a dose of 1.0 E12 and 1.0 E18 atoms per centimeter squared.

A suitable chamber for forming depth 226 and 236, include various chambers for performing isotropic ion implantation (e.g., a chamber suitable for performing plasma immersion ion implantation). For instance, such chambers include an ionization chamber, an ion implantation chamber, an isotropic ion implantation chamber, a plasma immersion ion implantation chamber, etc.

For example, a sufficient conformal depth and/or concentration of arsenic impurities may be implanted to form conformal depth 226 and/or 236 to reduce a current leakage amount between junction regions formed in junction recesses 270 and 280 (e.g., junction regions formed by material grown or deposited in junction recesses 270 and 280, or described herein). Similarly, a sufficient depth and/or concentration of arsenic impurities may be implanted to reduce a lateral depletion width of a channel of apparatus 100 (e.g., a transistor channel defined in well 124 of substrate 120 under surface 125 between tip 276 and tip 286).

Likewise, a sufficient depth and/or concentration of carbon impurities may be implanted in conformal depth 226 and/or 236 to reduce boron out-diffusion between junction regions formed in junction recess 270 and 280 (e.g., junction regions formed in junction recesses 270 and 280 as described herein) during subsequent thermal treatment or annealing. Specifically, conformal depth 226 and 236 may include a sufficient depth and/or concentration of carbon atoms to that when material deposited in junction recesses 270 and 280 having boron and/or indium impurities implanted therein is heated (e.g., during a subsequent annealing or thermal treatment of apparatus 200), the boron and/or indium impurities are reduced in movement or prohibited from moving through conformal depth 226 and/or 236. Thus, diffusion or extension of boron and/or indium atoms or impurities is reduced from extending into a transistor channel between sidewall surfaces 220 (e.g., and/or tip 276) and sidewall surface 230 (e.g., and/or tip 286).

Figure 3:
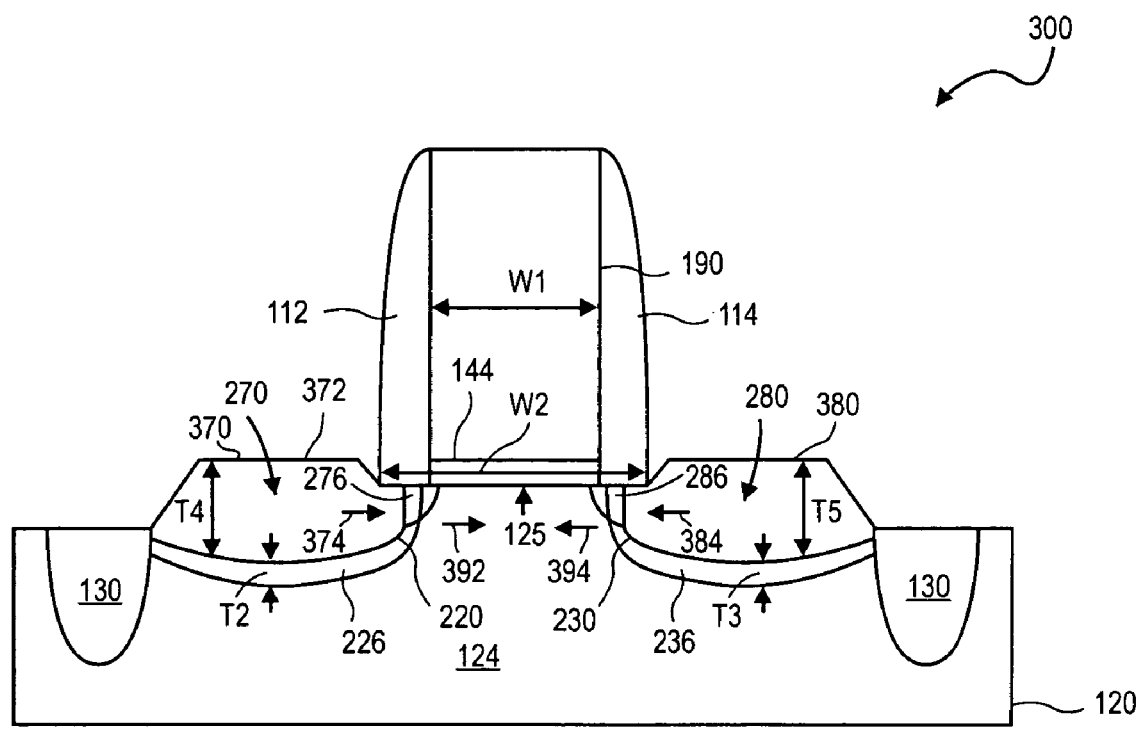
FIG. 3 shows the substrate of FIG. 2 after forming a thickness of a material in the junction recesses to form junction regions.

For example, FIG. 3 shows the substrate of FIG. 2 after forming thickness of a material in the junction recesses to form junction regions. FIG. 3 shows apparatus 300 having material 370 formed in junction recess 270 and material 380 formed in junction recess 280. Material 370 and/or material 380 may be described as a junction region, a source region, a drain region, and/or diffusion region. In addition, material 370 may be formed to have junction region top surface 372 that is superior to top surface 125 of substrate 120. Likewise, material 380 may be formed to have junction region top surface 382 that is also superior to top surface 125. For example, material 370 may be thickness T4 of an epitaxial thickness of crystalline silicon germanium material (e.g., SiGe or $Si_xGe_{1-x}$), where the size and/or thickness T4 is sufficient to cause a compressive strain in substrate 120. Similarly, material 380 may be a thickness T5 of an epitaxial thickness of crystalline silicon germanium (SiGe) having a sufficient size and/or thickness T5 to cause a compressive strain in substrate 120. Moreover, material 370 and 380 may be a sufficient epitaxial thickness of a crystalline alloy (e.g., SiGe material) to cause a compressive strain in a channel of apparatus 300 (e.g., a region of well 124 below top surface 125, and between tip 276 and tip 286).

For example, as shown in FIG. 3, material 370 may cause compressive strain 374 towards a portion of substrate 120 under top surface 125, and material 380 may cause compressive strain 384 towards the same portion of substrate 120. Thus, strain 374 may cause compressive strain 392 and strain 384 may cause compressive strain 394 in a channel of substrate 120 between material 370 and material 380 (e.g., a compressive strain between tip 276 and tip 286 and in the channel of apparatus 300, where apparatus 300 is a PMOS device). It can be appreciated that compressive strains 392 and 394 may be strains between sidewall surfaces 220 and 230 sufficient to increase carrier mobility (e.g., mobility of holes in the channel of well 124) between material 370 and material 380. In other words, a channel in substrate 120 may be under a strain caused by a lattice spacing of material 370 and/or material 380 (e.g., where material 370 and material 380 are silicon germanium material) being larger than a lattice spacing of substrate material 120.

Material 370 and material 380 may be deposited by chemical vapor deposition or other processes described above for forming gate dielectric 144. For example, material 370 and material 380 may be formed in a CVD chamber, an RTCVD chamber, an RPCVD chamber, a high purity and high flow hydrogen ($H_2$) purge reactor, a chlorine ($Cl_2$) etch chamber or a trisilane deposition reactor. Suitable chambers include those in which a blanket or selective deposition of crystalline and/or amorphous silicon, silicon doped, and/or silicon alloy materials may be formed. For example, depth 226 and 236, and material 370 and 380 can be formed in a chamber having a pressure of between 1E-4 Torr and 1000 Torr.

In addition, material 370 and 380 may be doped, such as by boron and/or indium to form P-type junction region material having an electronically positive charge. In one embodiment, material 370 and material 380 may be boron doped epitaxial crystalline silicon germanium material formed in junction recess and 280 and subsequently doped with additional boron. Subsequent to forming material 370 and 380, apparatus 300 may be thermally treated, such as by annealing. Thus, for instance, with or without such thermal treatment, boron atoms or impurities in material 370 and 380 may diffuse into conformal depth 226 and 236, but be abated or reduced in their movement or concentration by conformal depth 226 and 236 from moving into substrate 120, well 124, or a channel between material 370 and material 380.

Specifically, conformal depth 226 may have depth T2 sufficiently thick and/or including a sufficient concentration of carbon impurities to reduce boron out-diffusion of boron impurities from material 370 into substrate 120, and/or into a channel between material 370 and material 380. Likewise, conformal depth 236 may have depth T3 sufficiently thick and/or having a sufficient concentration of carbon impurities to reduce boron out-diffusion from material 380 into substrate 120, and/or into a channel between material 380 and material 370.

Moreover, as described above, conformal depth 226 may include depth T2 sufficiently thick and/or having a sufficient concentration of arsenic atoms to reduce a current leakage amount and/or a lateral depletion width between material 370 and material 380. Likewise, conformal depth 236 may have depth T3 sufficiently thick and/or having a sufficient amount of arsenic impurities to reduce a current leakage amount and/or lateral depletion width between material 380 and material 370.

In addition, it is contemplated that depth T2 and/or depth T3 may be a depth of between 10 and 250 angstroms. For example, depth T2 may be a depth in a range caused by implanting arsenic (As) at an ion energy of between 10 and 70 Kilo-electron volts and at a dose of between 1.0 E12 and 1.0 E14 atoms per centimeter squared into junction recess 270 of substrate 120. Also, it is contemplated that depth T2 may be a depth in a range caused by implanting carbon (C) at an ion energy of between 2.0 and 15 Kilo-electron volts, and at a dose of between 1.0 E14 and 1.0 E16 atoms per centimeter squared into junction recess 270 of substrate 120. Moreover, depth T3 may be a depth having arsenic and/or boron atoms similar to depth T2 described above.

According to embodiments, the implanting of impurities to form conformal depth 226 and 236, as described herein may reduce undesired impurities (e.g., impurities other than carbon and/or arsenic) in conformal depth 226 and 236, and material 370 and 380. Moreover, ion implantation of carbon and/or arsenic to form conformal depth 226 and 236 may better serve the functions of traditional "halo" implantation, such as reducing lateral depletion region width, suppressing boron out-diffusion, and improving short channel effects. Thus, the distance between material 370 and 380, length W2, length W1, and/or the length of a channel in well 124 may be reduced in length. For example, in apparatus 300, channel length may be decreased by bringing material 370 and material 380 closer together or by further undercutting and extending tips 276 and 286 under gate dielectric 144, without increasing current leakage, lateral depletion width, or boron out-diffusion for apparatus 300 (e.g., between material 370 and 380). Thus, according to the teachings herein, apparatus 300 may be a transistor having a shorter channel length or distance between material 370 and material 380 (e.g., having a higher drive current). Alternatively, apparatus 300 may be a transistor with less leakage or boron out-diffusion.

Figure 4:
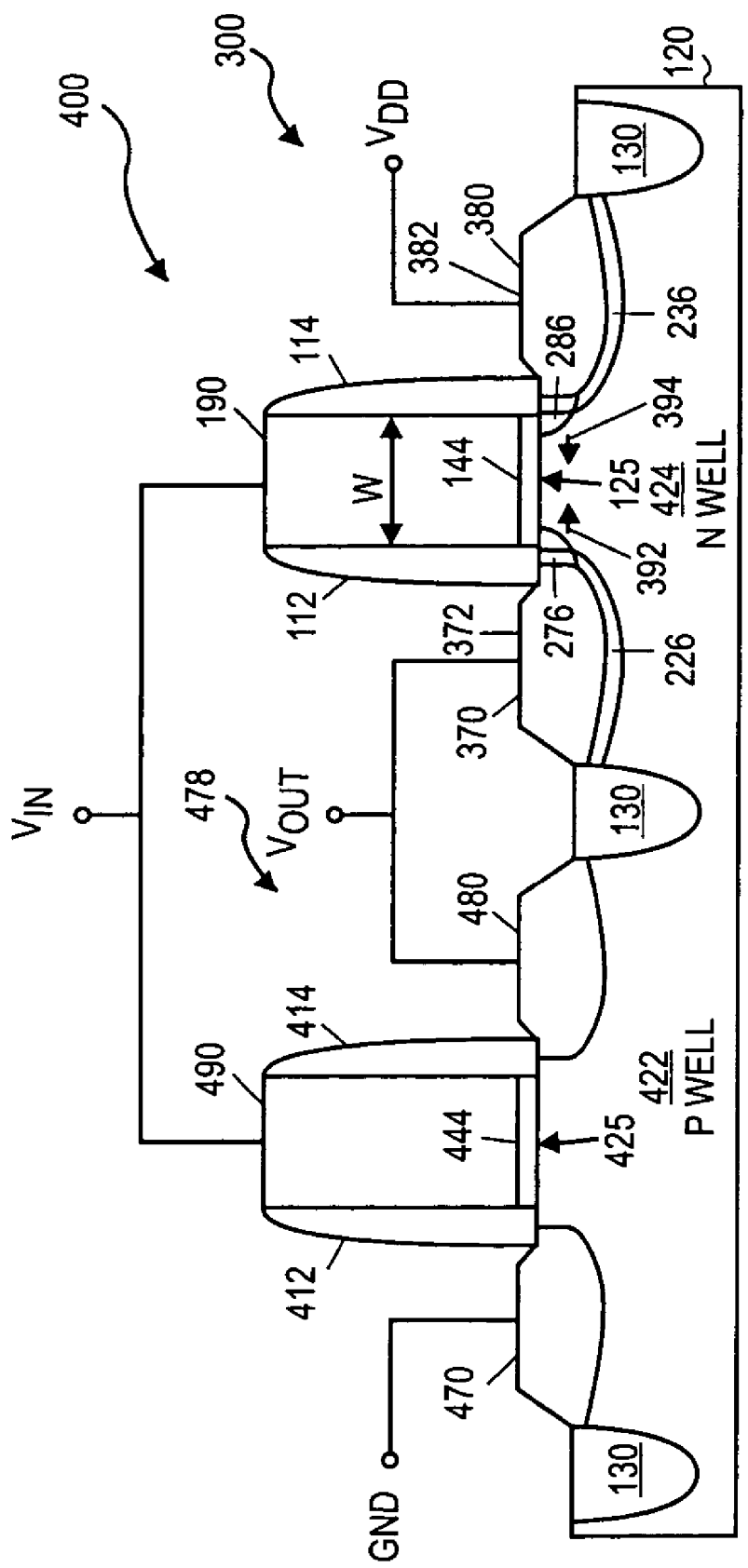
FIG. 4 shows a representative CMOS structure.

For example, FIG. 4 shows a representative CMOS structure. FIG. 4 shows CMOS device 400 having PMOS device, such as apparatus 300 as described above, connected to NMOS transistor device 478 in typical fashion. As such, it can be appreciated that substrate 120 may include P-type well 422 related to N-type well 124 for forming CMOS device 400, such that P-type well 422 is part of NMOS transistor device 478 formed on a second area of substrate 120 and defining a different second interface surface 425 of substrate 120 adjacent to N-type well 124. Specifically, for instance, NMOS device 478 may be formed adjacent to PMOS apparatus 300 such as by having NMOS device 478 electronically isolated from PMOS apparatus 300 by electrically insulating material 130 as described herein. Moreover, NMOS device 478 may include a channel below gate dielectric 444 which is below gate electrode 490, and between N-type junction regions 470 and 480. NMOS device 478 is also shown with spacers 412 and 414. Thus, CMOS device 400 has ground GND, input voltage $V_{in}$, output voltage $V_{out}$, and bias voltage $V_{DD}$.

In the foregoing specification, specific embodiments are described. However, various modifications and changes may be made thereto without departing from the broader spirit and scope of embodiments as set forth in the claims. The specification and drawings are, accordingly, to be regarded in an illustrative rather than a restrictive sense.

What is claimed is:

1. A method comprising:

implanting a first conformal depth of an impurity in a first surface of a substrate defined by a first junction recess adjacent a gate electrode and implanting a second conformal depth of the impurity in a different second surface of the substrate defined by a second junction recess adjacent the gate electrode, wherein implanting is by plasma immersion ion implantation, wherein implanting the first and second depth each comprises implanting arsenic (As), and then implanting carbon (C), and wherein the first surface includes a first sidewall surface of the substrate adjacent the gate electrode, and the second surface includes a second sidewall surface adjacent the gate electrode.

2. The method of claim 1, wherein implanting comprises implanting one of arsenic (As) and carbon (C).

3. The method of claim 2, wherein implanting comprises one of implanting arsenic (As) at an ion energy of between 10 and 70 Kilo-electron volts and at a dose of between 1.0 E12 and 1.0 E14 atoms per centimeter squared, and implanting carbon (C) at an ion energy of between 2.0 and 15 Kilo-electron volts, and at a dose of between 1.0 E14 and 1.0 E16 atoms per centimeter squared.

4. The method of claim 1, wherein the first junction recess and the second junction recess extend under and superadjacent to a first spacer and a second spacer on a first sidewall surface and a second sidewall surface of the gate electrode, and implanting a first and second conformal depth comprises implanting the conformal depth in the substrate under and superadjacent to the first spacer and the second spacer.

5. The method of claim 4, wherein the first junction recess and the second junction recess extend under the gate electrode, and implanting a first and second conformal depth comprises implanting the conformal depth in the substrate under the gate electrode.

6. The method of claim 1, wherein a surface of the substrate defines a top surface of the substrate, and further comprising:

forming a first junction region of an epitaxial crystalline material in the first junction recess having a first junction region top surface that is superior to the top surface of the substrate;

forming a different second junction region of the epitaxial crystalline material in the second junction recess having a second junction region top surface that is superior to the top surface of the substrate.

7. The method of claim 6, wherein forming comprises depositing a sufficient epitaxial thickness of a crystalline silicon germanium (SiGe) material in the first junction recess and in the second junction recess to cause a compressive strain in the substrate between the first and second junction recesses.

8. The method of claim 6, wherein forming comprises depositing the epitaxial crystalline material in the first junction recess and in the second junction recess with one of boron and indium to form a P-type first junction region and second junction region.

9. A method comprising:

implanting a first conformal depth of an impurity in a first sidewall surface of a substrate adjacent a gate electrode, the first sidewall surface defined by a first junction recess and comprising a first tip region of material;

implanting a second conformal depth of the impurity in a different second sidewall surface of the substrate adjacent the gate electrode, the second sidewall surface defined by a second junction recess and comprising a second tip region of material wherein implanting the first and second depth comprises implanting carbon (C), and then arsenic (As).

10. The method of claim 9, wherein implanting a first and second depth comprises implanting the first conformal depth in a first junction base surface of the substrate defined by the first junction recess, and implanting the second depth in a second junction base surface of the substrate defined by the second junction recess.

11. The method of claim 9, further comprising:

forming a first thickness of an epitaxial crystalline boron doped silicon germanium material in the first junction recess; and forming a second thickness of the epitaxial crystalline boron doped silicon germanium material in the second junction recess, wherein the first thickness and the second thickness are sufficient to cause a compressive strain in the substrate between the first and second sidewall surfaces.

12. The method of claim 11, further comprising:

one of thermally treating and annealing the first thickness of an epitaxial crystalline boron doped silicon germanium material to cause a plurality of boron atoms in the first thickness to diffuse into the first conformal depth; and one of thermally treating and annealing the second thickness of an epitaxial crystalline boron doped silicon germanium material to cause a plurality of boron atoms in the second thickness to diffuse into the second conformal depth.

13. A method comprising:

implanting a first conformal depth of an impurity in a first sidewall surface of a substrate adjacent a gate electrode, the first sidewall surface defined by a first junction recess and comprising a first tip region of material;

implanting a second conformal depth of the impurity in a different second sidewall surface of the substrate adjacent the gate electrode, the second sidewall surface defined by a second junction recess and comprising a second tip region of material, wherein implanting the first and second depth comprises implanting Arsenic (As), and then carbon (C).

14. A method comprising:

implanting a first conformal depth of an impurity in a first surface of a substrate defined by a first junction recess adjacent a gate electrode and implanting a second conformal depth of the impurity in a different second surface of the substrate defined by a second junction recess adjacent the gate electrode, wherein implanting is by plasma immersion ion implantation, wherein implanting the first and second depth, each comprises implanting carbon (C), and then implanting arsenic (As), and wherein the first surface includes a first sidewall surface of the substrate adjacent the gate electrode, and the second surface includes a second sidewall surface adjacent the gate electrode.

15. A method comprising:

implanting a first conformal depth of arsenic (As) in a sidewall surface of a substrate adjacent a gate electrode, the sidewall surface defined by a junction recess;

implanting a second conformal depth of carbon (C) in the sidewall surface.

16. The method of claim 15, wherein implanting the first and second conformal depth are each doping by isotropic ion implantation.

17. A method comprising implanting a first conformal depth of carbon (C) in a sidewall surface of a substrate adjacent a gate electrode, the sidewall surface defined by a junction recess;

implanting a second conformal depth of arsenic (As) in the sidewall surface.

18. The method of claim 17, wherein implanting the first and the second conformal depth are each doping by isotropic ion implantation.

* * * * *